United States Patent [19]

Rutt et al.

[11] 4,353,957
[45] Oct. 12, 1982

[54] CERAMIC MATRICES FOR ELECTRONIC DEVICES AND PROCESS FOR FORMING SAME

[75] Inventors: Truman C. Rutt, Niagara Falls; James A. Stynes, Lewiston, both of N.Y.

[73] Assignee: Tam Ceramics Inc., Niagara Falls, N.Y.

[21] Appl. No.: 845,497

[22] Filed: Oct. 26, 1977

Related U.S. Application Data

[62] Division of Ser. No. 536,274, Dec. 24, 1974, abandoned, which is a division of Ser. No. 400,243, Sep. 24, 1973, Pat. No. 3,879,645.

[51] Int. Cl.³ .................... C04B 33/32; H05K 1/00
[52] U.S. Cl. ............................ 428/292; 174/68.5; 264/59; 264/61; 427/97; 428/110; 428/136
[58] Field of Search ............... 361/321, 303; 428/131, 428/134, 119, 120, 116, 136, 110, 292; 427/96, 97; 264/50-61; 174/68.5

[56] References Cited

U.S. PATENT DOCUMENTS

| | | | |
|---|---|---|---|
| 2,728,054 | 12/1955 | Schoenberg | 336/83 |
| 2,919,483 | 1/1960 | Gravley | 361/321 X |
| 3,275,916 | 9/1966 | Phillips | 361/303 |
| 3,277,354 | 10/1966 | Ikeda | 361/321 |
| 3,325,266 | 6/1967 | Stong | 428/120 X |
| 3,617,369 | 1/1969 | Lombard | 428/131 |
| 3,679,950 | 7/1972 | Rutt | 361/321 |
| 3,838,204 | 9/1974 | Ahn | 174/68.5 |
| 3,886,014 | 5/1975 | Bayer | 65/43 |
| 3,902,883 | 9/1975 | Bayer | 65/43 |
| 4,030,004 | 6/1977 | Rutt | 428/136 X |

Primary Examiner—Elliot A. Goldberg

[57] ABSTRACT

Monolithic capacitors are produced by (1) providing on a plurality of thin leaves or sheets of suitable finely divided ceramic material bonded with a thermally-fugitive temporary bond, coatings comprising thin, selected patterns of pseudo-conductive material that consists essentially of thermally-fugitive material, one or more ceramic or metal granules, and a thermally-fugitive bond; (2) forming a consolidated stack from a plurality of the coated leaves or sheets; (3) firing the resulting body to remove the thermally-fugitive materials and sinter the ceramic material into a monolithic body in which there are thin cavities or open spaces which are interrupted only by one or more distinct ceramic or metal pillars, substantially all of which, when there are a plurality, are distinct and separated; (4) introducing conductive material, preferably metal, into the resulting cavities; and (5) providing suitable electrical connections to the resulting conductive layers. Alternative procedures for producing pillars in said thin spaces or cavities and an analogous procedure for forming multilayer ceramic circuit structures are described.

26 Claims, 10 Drawing Figures

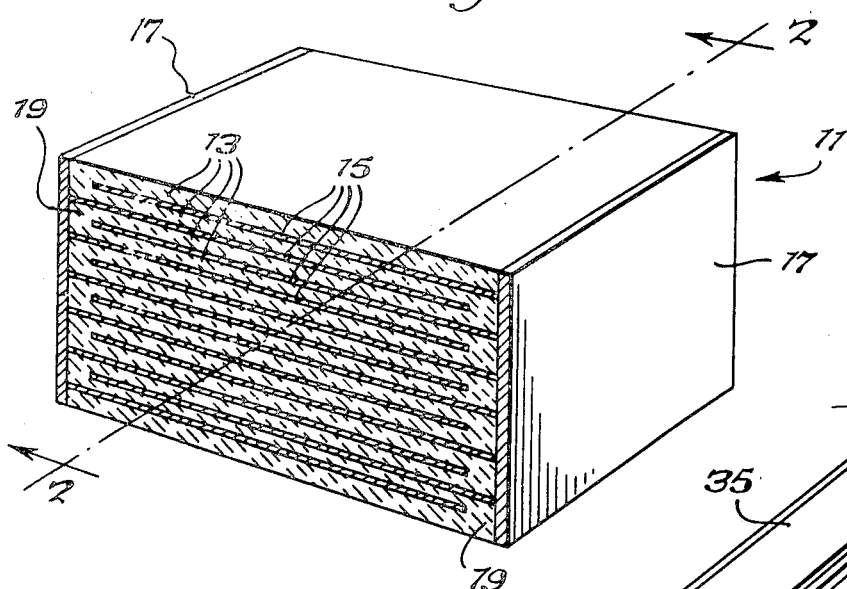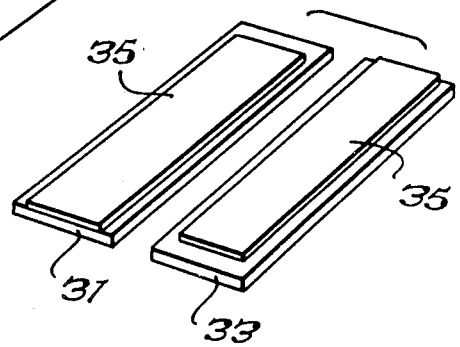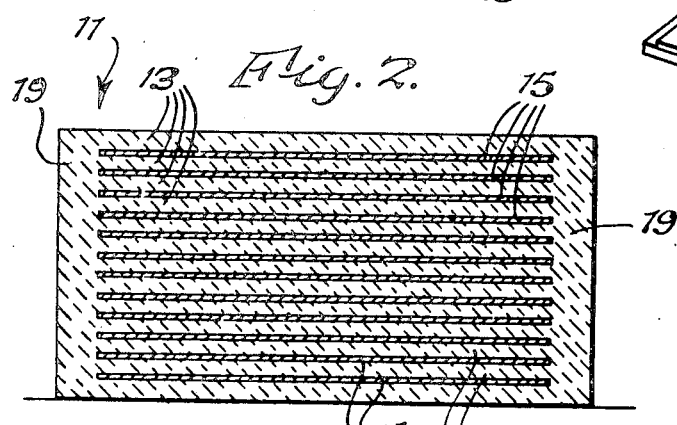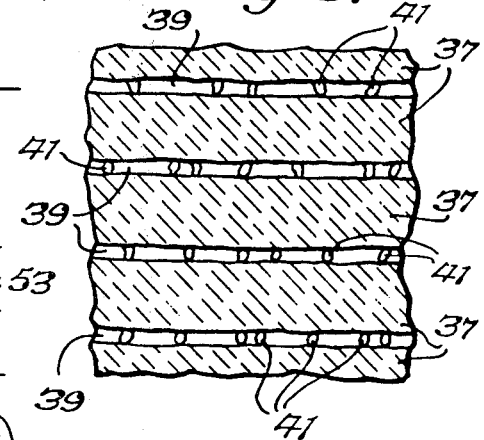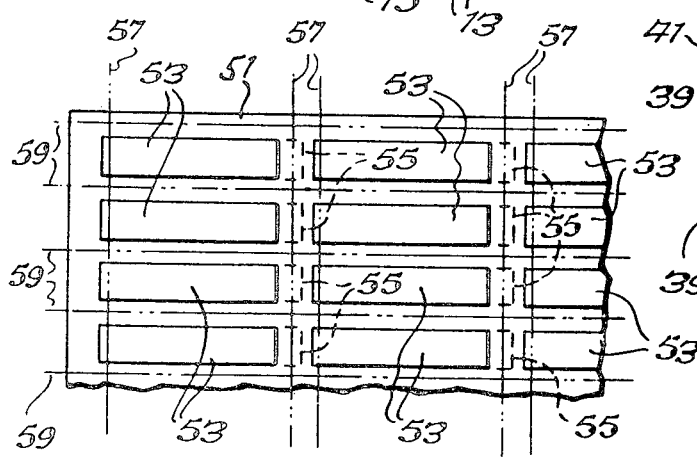

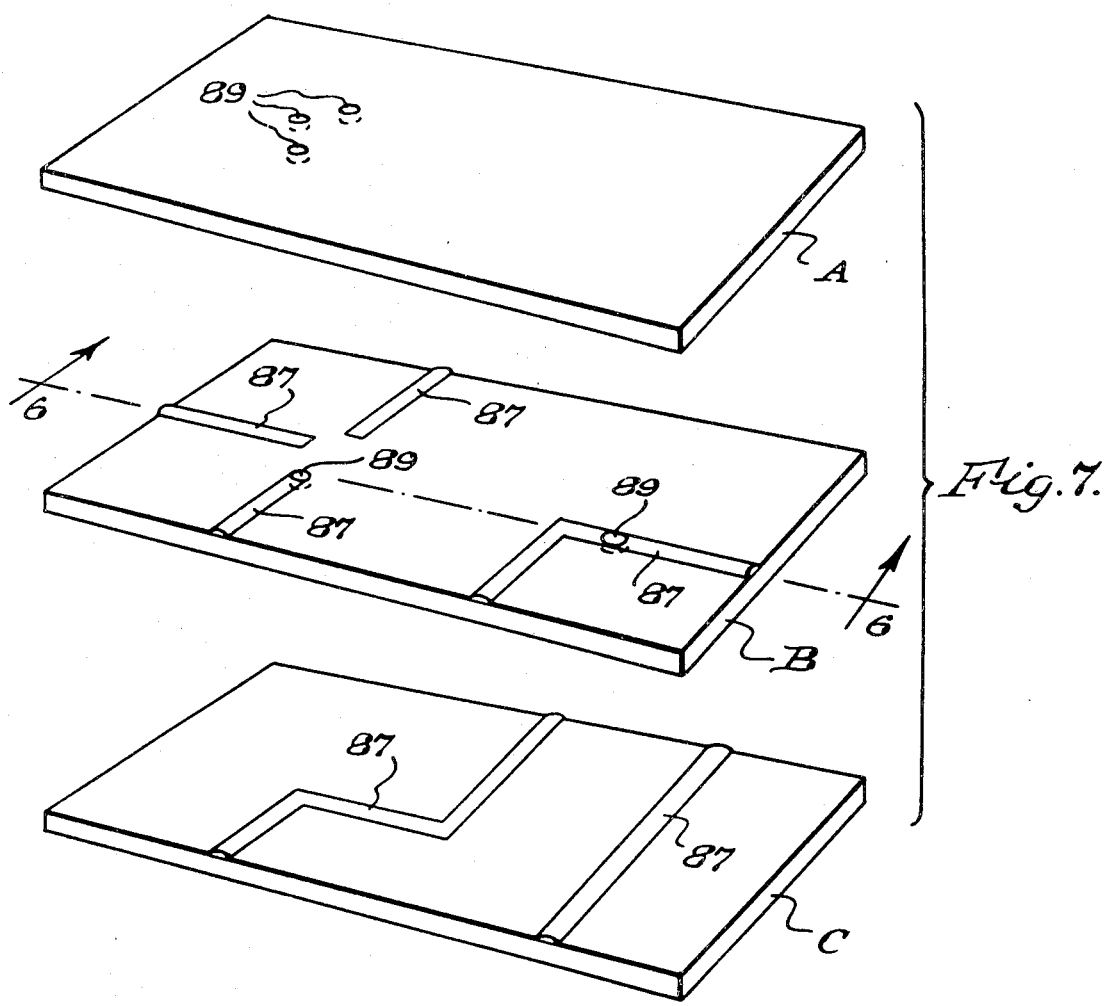
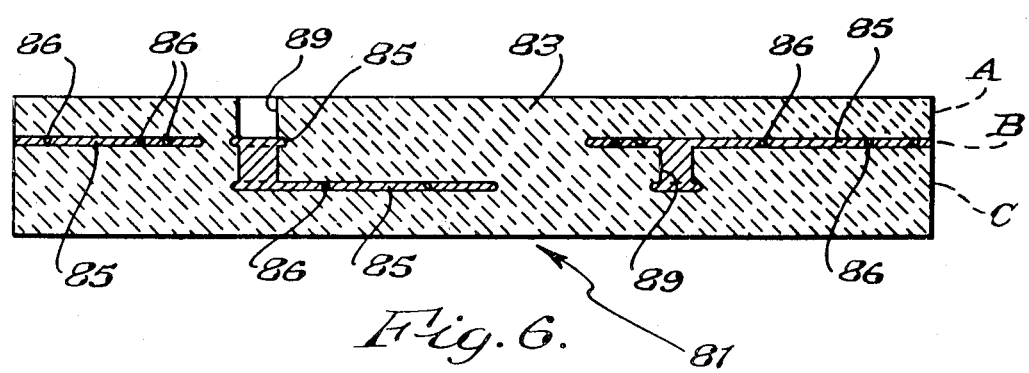

CERAMIC MATRICES FOR ELECTRONIC DEVICES AND PROCESS FOR FORMING SAME

This application is a division of application Ser. No. 536,274, filed Dec. 24, 1974 and now abandoned, which was a division of application Ser. No. 400,243, filed Sept. 24, 1973, now U.S. Pat. No. 3,879,645, Apr. 22, 1975.

BACKGROUND OF THE INVENTION

In its simplest form a ceramic capacitor consists of a relatively thin wafer of desired shape and size formed by firing a ceramic dielectric composition, the wafer having electrodes on the opposite faces thereof. In many cases, however, it is desired to use a capacitor having a plurality of such wafers alternating with conductive layers, alternate ones of said conductive layers being exposed at the same edge faces of the capacitor and electrically joined there, for example by a termination electrode.

In a typical known method for producing such ceramic capacitors, an electroding paste of a noble metal such as platinum or palladium is applied to the top face of a small, usually cast, thin sheet of a suitable ceramic dielectric composition bonded with an organic temporary binder, the application being made in such manner that the deposit of electroding paste extends to one edge of the sheet only and a clear margin is left around three sides of the deposit. A plurality of the small sheets thus coated with electrode paste are then stacked, successive sheets being rotated about an axis normal to the plane of the sheet, whereby successive electroding paste deposits extend to opposite edges of the stack. The stack of paste-coated sheets is then suitably consolidated and heated to drive off or decompose the organic binders of the ceramic sheet and the electroding paste and to sinter the dielectric composition into a unitary, multilayer body having successive electrodes exposed on opposite ends thereof. The electrodes exposed on each end are then electrically connected with a termination electrode in known manner.

Because of the necessity for using noble metal internal electrodes in the process just described, monolithic ceramic capacitors are expensive. Lower cost, silver electrodes such as are commonly used with other ceramic capacitors are generally unsuitable for monolithic capacitors because the silver, applied as an electrode paste, would be subjected to a high temperature during firing to mature the ceramic and would thereby be deleteriously affected. Accordingly, a method of producing monolithic capacitors that does not require the use of noble or very expensive metals has been desired.

Such a method has been described in U.S. Pat. No. 3,679,950, granted July 25, 1972. In that patent a number of procedures are disclosed which involve the formation of sintered ceramic matrices that have strata of dense dielectric material alternating with strata of porous ceramic material and the subsequent deposition of conductive material, which may be low-cost metals, in said porous strata.

While very satisfactory, relatively inexpensive, monolithic capacitors have been made by methods disclosed in the above-mentioned patent, maintaining continuity of metal in the internal electrodes has been found to be a problem at times. It is also desirable, particularly when producing capacitors for use at high frequency, to keep the electrode resistance as low as possible.

Accordingly, it is an object of the present invention to provide an improvement on the procedures disclosed in the above-mentioned patent which will result in the production of sintered ceramic matrices in which internal electrodes can be formed by introduction of conductive material, such as metal, to form capacitors wherein continuity of and low resistance in such electrodes is easily obtained, while the ceramic matrix prior to impregnation has adequate strength.

SUMMARY OF THE INVENTION

The foregoing object of the invention is achieved by providing as matrices ceramic bodies that have a plurality of superposed thin layers or strata of dense dielectric material, adjacent layers having between them thin spaces or cavities open at one edge region that are substantially planar. The spaces or cavities are interrupted only by one or more distinct pillars, substantially all of which, when there are a plurality, are separated. Thus, it is possible to readily introduce conductive material, such as metal, into the cavities in the matrix to provide a body having continuous conductive layers or strata alternating with dielectric ceramic strata. More specifically, the invention of the present application comprises a capacitor formed by introducing a conductive material, metal being generally preferred, into one or more thin, essentially planar spaces between thin strata of dense dielectric material in a unitary, sintered ceramic body, said strata being integrally joined at a plurality of edge portions and said thin space or spaces being interrupted only by one or more distinct metal or ceramic pillars, substantially all of said pillars, when there are a plurality, being separated. In the resulting capacitor, the internal electrodes have low resistance since the spaces between the dielectric strata were only obstructed to a small degree. The invention also comprehends production of other ceramic devices having internal electrodes, such as multilayer circuit structures, by a substantially similar procedure. In the production of both capacitors and multilayer circuit structures, the procedure includes the use of pseudo-conductors composed largely of thermally-fugitive material that is removed when the ceramic is fired, thereby providing cavities or channels into which conductive material is introduced. The shape, size, and location of the conductors and/or electrodes are essentially the same as those of the pseudo-conductive electrodes or lines in the green, unfired body, which they replace.

SHORT DESCRIPTION OF THE DRAWINGS

FIG. 1 is a sectional view of a capacitor produced in accordance with the present invention;

FIG. 2 is a sectional view taken on line 2—2 of FIG. 1 of such a capacitor;

FIG. 3 is an enlarged perspective view of two leaves of a bonded, ceramic, dielectric composition, each leaf having thereon a layer of a composition consisting of thermally-fugitive material having dispersed therein a minor amount of ceramic granules;

FIG. 4 is a fragmentary plan view of a bonded leaf or sheet of a ceramic dielectric composition having thereon a patterned layer which consists of thermally-fugitive material having dispersed therein a minor amount of ceramic granules;

FIG. 5 is a further enlarged, fragmentary, sectional view of a ceramic body according to the present invention after assembly, consolidation, and sintering of a plurality of coated leaves such as shown in FIG. 3;

FIG. 6 is an enlarged sectional view of a multilayer circuit structure according to the present invention;

FIG. 7 is an enlarged exploded view showing the several ceramic sheets forming the structure illustrated in FIG. 6 with pseudoconductors thereon;

Figure 8:
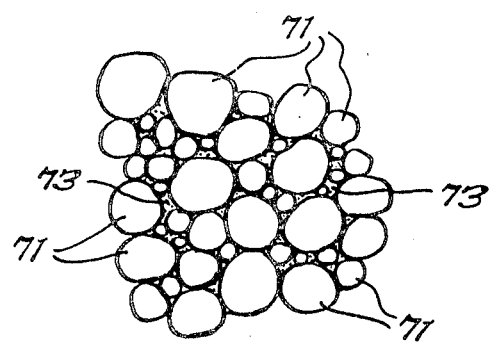
FIG. 8 is a greatly enlarged view of a bonded, composite, ceramic granule suitable for use in carrying out the present invention.

It should be noted that in the drawings certain relative dimensions are exaggerated.

DESCRIPTION OF THE INVENTION

In accordance with the present invention a monolithic capacitor can be produced in the following manner.

A plurality of thin leaves of a finely divided ceramic composition are made by the use of a thermally-fugitive bonding material, for example, a resin or cellulose derivative, the ceramic composition being such as to form a dense dielectric layer when sintered. Such compositions, many of which are well known, include barium titanate, with or without admixed modifiers of the dielectric constant and/or other properties thereof, as well as many other types of ceramic compositions. There is then applied to each of a plurality of said leaves a thin layer which consists principally of thermally-fugitive material having dispersed therein a minor amount of ceramic and/or metallic granules of such size as to extend substantially through said layer. These layers may be preformed, but preferably are produced by depositing a liquid or pasty composition on the leaves, for example, by painting or screen printing. The thermally-fugitive material of said layers, hereinafter sometimes referred to as pseudo-conductors, may be a suitable combustible and/or volatile organic film-forming material, but is preferably a mixture of fine combustible and/or volatile particles bonded with such a film-forming material. The ceramic and/or metal granules may be mixed with and dispersed in the film-forming material of the layers.

The layers referred to above are smaller in surface area than the thin leaves to which they are applied and each layer is of such shape as to allow a margin of the associated leaf to extend around a major portion of the perimeter of the layer while a portion of the latter extends to an edge of the leaf on which it is deposited. Preferably, the layers are equal in size.

A plurality of the leaves of the bonded ceramic composition are then stacked, with layers of the granule-containing, thermally-fugitive composition intervening, and consolidated. The consolidation can be accomplished by means suitable to the particular materials employed and may involve pressing, heating, and/or the use of a solvent. The leaves and intervening layers in the stack are so arranged that successive layers extend to different edge regions of the consolidated stack, but a major portion of the edges of each of said leaves is in contact with the edges of the adjacent leaves in the stack. The consolidated stack of leaves and intervening layers is then fired to remove the thermally-fugitive materials and to sinter the ceramic composition. There is thereby formed an integral, sintered, ceramic body having a plurality of thin sheets or strata of dense dielectric material, said sheets being joined at portions of their edges but being separated from one another over substantial portions of their adjacent surfaces and having between them thin cavities interrupted only by one or more distinct ceramic and/or metal pillars, substantially all of which, when there are a plurality, are separate.

At the edge regions of the sintered body to which the layers of heat-fugitive material containing the granules of metal and/or ceramic material extended, there are openings into the thin cavities between adjacent ceramic sheets. Through such openings a conductive material, such as metal, may be introduced into said spaces by a suitable method, for example one of the methods disclosed in U.S. Pat. No. 3,679,950. The result is a body to which termination electrodes can be applied by any desired procedure to form a capacitor and which may, if desired, be suitably encapsulated after leads are attached to such termination electrodes.

Obviously, various modifications and variations of the procedure set forth above may be made and a number of these will be described hereinafter.

DETAILED DESCRIPTION OF AN EMBODIMENT

Although, as pointed out above, there are a number of variations and modifications possible, a procedure preferred when producing a few rather large monolithic capacitors, is essentially that above-described. A fully detailed description of the procedure is as follows:

EXAMPLE 1

A dispersion is made by ball-miling for 4 hours the following composition:

400 g dielectric powder*
4 g diethylene glycol laurate
30 g butylbenzyl phthalate
120 ml toluene

*96 parts $BaTiO_3$, 4 parts $CeO_2.ZrO_2$; all having an average particle size range of 1–2$\mu$ After such milling, the dispersion is added to a solution formed by dissolving 37 g of ethyl cellulose in 180 ml of toluene and stirred to obtain thorough mixing. The mixture is then de-aired and a film of the mixture, approximately 100 mm by 1500 mm in size is formed with a doctor blade on a smooth sheet of glass. The film, which after drying is approximately 0.045 mm thick, is removed and cut into small, rectangular sheets or leaves, each approximately 10 mm by 20 mm.

A thermally-fugitive composition for depositing a pseudo-conductive layer on the leaves prepared as above described may be made by mixing, for example on a 3-roll mill, 25 g of finely divided carbon with 50 g of a 50% solution of a phenolic-modified, rosin ester resin (PENTALYN ® 858) in a high-boiling, aliphatic petroleum naptha solvent which has a Kauri-butanol value of 33.8 (No. 460 Solvent). To this composition is added 20 g of ceramic granules such as shown in FIG. 8, approximately $-37\mu + 20\mu$ in size, formed from barium titanate powder in the manner hereinafter described. The viscosity of the composition is then made suitable for screen printing by mixing therewith additional naptha solvent. The resulting composition or ink, as it is often referred to, is screen printed on one side of each of a plurality of the leaves of the dielectric composition in a layer about 0.01 mm in thickness when dry. It will be observed that care should be taken in forming the granule-containing layers to use components which do not dissolve or unduly soften the bonding material in the leaves of dielectric material. Preferably, the solvents used are aliphatic, petroleum naphthas with a low (about 35) Kauri-butanol value and an evaporation rate slow enough so that the ink does not blind the printing screen used between printing cycles. The granule-containing, heat-fugitive ink layer or pseudo-conductor is so applied to each of the leaves or sheets of bonded dielectric material that the layer extends to one edge of the leaf but has a substantial margin around it on its other sides.

The printed leaves are then indexed and stacked in groups of ten so that on alternate leaves in each group the edges of the leaves to which the printed layers extend are aligned and the intervening leaves are turned horizontally 180° whereby the printed layers thereon are exposed at the opposite end region of the stack. Non-printed leaves are placed on the top and bottom of the stack. The stack is then consolidated by applying a pressure of about 104 kg/cm² thereto at a temperature of about 85° C. for 1 minute to obtain a coherent green body or chip, as these bodies are frequently referred to. The chips are then heated to remove the thermally-fugitive materials therein and to sinter the ceramic composition.

To preclude possible disruption of the chips during firing, they are first heated slowly, in air, to remove the thermally-fugitive components and are subsequently fired at a higher temperature to form small, coherent, sintered matrices or chips, each of which has a plurality of thin strata of dense, dielectric material that are integrally joined at a plurality of edge portions thereof and has between said strata thin cavities that are interrupted only by distinct ceramic pillars substantially all of which are separate, i.e. spaced apart. Each of the cavities has an opening from one of the edge regions of the chip because of the extension of each of the several granule-containing, heat-fugitive printed layers to an edge of a leaf of dielectric composition when the green chip was formed. Since the printed leaves were stacked with alternate granule-containing layers extending to the same edge region of the stack, the openings to the adjacent cavities in the sintered chip are at opposite edge regions of the chip.

A suitable heating schedule for removal of the thermally-fugitive materials in the green chips is as follows, all temperatures being in degrees C:

| to 160 - 2 hours | 310 to 314 - 4 hours |
| 160 to 220 - 10 hours | at 400 - 1 hour |
| 220 to 225 - 12 hours | at 500 - 1 hour |
| 225 to 310 - 20 hours | at 600 - 1 hour |

Upon completion of the foregoing schedule, the temperature is raised to 1370° C. and maintained at that level for 1.25 hours to sinter the chips.

After cooling of the sintered chips, the cavities therein are filled with conductive material, metal being preferred, any of the methods disclosed in the above-mentioned U.S. patent being suitable. Termination electrodes are then applied by any suitable means, the application of such electrodes being well known. Alternatively, the end terminations can be applied and the cavities then filled with metal in accordance with the disclosure in copending U.S. patent application, Ser. No. 274,668.

FIGS. 1 and 2 of the accompanying drawings depict, on an enlarged and exaggerated scale, such a monolithic capacitor as that produced by the above-described procedure. The numeral 11 comprehensively designates the capacitor which has strata 13 of ceramic dielectric material with layers 15 of conductive material therebetween that serve as internal electrodes. The latter are so formed, as a result of the size and placement of the pillar-containing cavities into which the conductive material was introduced, that successive ones extend to the opposite end faces of the capacitor, the group of electrodes exposed at each end face being electrically joined by end termination electrodes 17. Where there is no intervening conductive material, the dielectric layers are united as shown at 19. They are also joined, of course, by the ceramic pillars (not shown) introduced in the pseudo-conductive layers.

In FIG. 3 there are shown enlarged, two thin sheets or leaves 31 and 33 of ceramic, dielectric material bonded with a thermally-fugitive bond, each of which has thereon a layer 35 composed of thermally-fugitive material in which is dispersed a plurality of ceramic granules. It will be seen that the layer 35 on the sheet 31 extends to the front edge of the sheet but has a margin around the sides and the rear thereof while the layer 35 on the sheet 33 extends to the rear edge of the sheet and has a margin around the sides and the front of the sheet. Thus, when a plurality of sheets 31 and 33 with the layers 35 thereon are stacked alternately, consolidated, and fired, the cavities produced in the resultant sintered body by removal of the thermally-fugitive material of the layers 35 will open alternately at opposite ends of the body.

FIG. 5 depicts, on a further enlarged scale, the structure of a fired ceramic body or chip, suitable as a matrix for production of a monolithic capacitor, which has been made in accordance with the present invention. The strata 37 are of dielectric material and the cavities or spaces 39 there between resulting from the removal of the thermally-fugitive material in layers 35 are unobstructed except for the pillars 41.

It will be understood that monolithic capacitors according to the present invention may be produced individually as described in the foregoing example. It is preferred, however, when a considerable number of capacitors are to be produced or when the individual capacitors are very small, to employ a procedure in which a plurality of green chips are produced simultaneously and sintered at the same time. Such a procedure is described in the following example.

EXAMPLE 2

Using the same ceramic dielectric composition and temporary organic bond therefor as in the preceding example, leaves 50 mm × 75 mm and about 0.05 mm thick after drying are prepared in the manner therein described. Using the same composition or ink as employed in Example 1 for forming the granule-containing, thermally-fugitive layers, a recurring printing. After the deposit has dried, forming a film about 0.01 mm thick, the printed leaves are indexed and stacked in groups of ten with the printed film pattern on each successive leaf being offset with respect to the pattern on the preceding one. Blocks are then formed by consolidating the stacked leaves, one or more unprinted leaves preferably being placed on the top and bottom of the stack, the consolidation being produced by applying a pressure of about 104 kg/cm² thereto at a temperature of about 85° C. for about a minute. There is thus obtained a green, solid block which is severed or cut, by suitable means such as knives, into smaller blocks or chips.

The manner in which this is done will be more readily understood by referring to FIG. 4 of the accompanying drawings. In that figure, the numeral 51 represents (somewhat enlarged and diagrammatic) a large leaf of ceramic dielectric material temporarily bonded with a thermally-fugitive bonding material. The spaced, rectangular elements 53 thereon are layers of the granule-containing, thermally-fugitive material that have been deposited thereon, e.g. by screen printing. In assembling a stack of such printed sheets for consolidation into a large block, all of the sheets are indexed so that the elements 53 thereon are vertically aligned along two opposite edges; but on successive sheets the elements are offset so that only on alternate sheets are the elements 53 wholly in vertical alignment. This is indicated in FIG. 4 by the areas 55 (shown in broken lines) which represent the offset, extending portions of the elements 53 on the leaves 51 located in the stack above and below the leaf 51 illustrated. After consolidation of the printed leaves into a green, large block (not shown) the block is severed, e.g. by cutting, along the lines 57 and 59 to form a plurality of smaller, green, ceramic blocks or chips in which the elements 53 are exposed alternately at opposite ends of the chips.

These chips are heated in the same manner as described in Example 1 to remove the thermally-fugitive materials and to sinter the dielectric composition of each into a unitary body having thin ceramic dielectric strata separated by thin cavities between said sheets, said cavities or spaces being interrupted only by distinct pillars substantially all of which are separate. By suitable procedures conductive material, preferably metal, is then introduced into said cavities and termination electrodes are provided on each end to electrically connect the conductive layers exposed at each said end. There are thus produced very satisfactory monolithic capacitors.

A somewhat modified procedure for forming a plurality of chips simultaneously is described below.

EXAMPLE 3

The same materials and procedure are employed as set forth above in Example 2 to form green blocks from leaves of a dielectric composition carrying thin films or elements of heat-fugitive materials containing granules of metal and/or ceramic. Then, instead of severing the block into a plurality of green chips, the whole block is heated to remove the thermally-fugitive materials and to sinter the ceramic material. The heating and sintering conditions may be substantially the same as those described above. However, because of the greater mass of the large blocks, a somewhat longer soaking time may be necessary to achieve proper sintering. After the blocks are sintered, they are severed, e.g. by a diamond saw, into the desired ceramic matrix chips by cutting along lines corresponding to the lines 57 and 59 in FIG. 3.

Although in the foregoing examples the dielectric materials used are modified barium titanate compositions, it will be clear that there are many other known ceramic dielectric compositions that may also be used. For example, $TiO_2$, glass, steatite, and barium strontium niobate, as well as barium titanate alone, can be used, suitable changes well known in the art being made as required in firing procedures and the like to achieve proper sintering. Obviously, the capacitance and other characteristics of the resulting capacitors will vary as a result of using materials with higher or lower dielectric constants.

It will also be understood that the composition of the granule-containing layers produced in accordance with the present invention may vary. The granules may be formed of a suitable ceramic material or of a high-melting, oxidation resistant metal, such as palladium, platinum, gold, and alloys thereof. Ceramic materials that may be used for granules are alumina, zirconia, and barium titanate. However, since it is generally important to avoid such reaction between the granules and the dielectric ceramic material as might modify the dielectric properties of the latter, ceramics that melt or react with the dielectric material are not suitable. It is preferred in most cases to use a material of the same composition as the dielectric material. As indicated above, the granules should be of such size as to extend substantially through the layer in which they are used. The number of or amount of granules in the layers may vary widely according to the member of pillars desired in the cavities that result from the removal of the heat-fugitive material in the layers. Very satisfactory results have been obtained when using small ceramic aggregates as granules.

FIG. 8 illustrates, greatly enlarged, such a ceramic aggregate before firing. The ceramic particles 71 are bonded with a thermally-fugitive bond 73. Such aggregates can be readily made, for example, by forming a mixture of finely divided ceramic dielectric material of the kind used for the dielectric leaves and a temporary bond such as employed therefor and allowing the mixture to dry. The mass is then broken up and bonded aggregates of the desired size are obtained by selective sieving. These aggregates may be fired under proper conditions to sinter together the individual ceramic particles therein. However, it will be seen that by using for granules, unfired aggregates such as described, sintering of the ceramic particles in the aggregates will take place contemporaneously with the sintering of the dielectric layers, and no problems are likely to arise from the unequal shrinkage that may occur when different materials are employed. Whether the aggregates used are fired or unfired, there is, of course, no danger of deleterious reaction between the granules and the dielectric material. While it should not be soluble in the solvent employed in depositing the pseudo-conductive layers, the nature of the temporary, thermally-fugitive bond used in forming such aggregates is not particularly critical, a number of suitable materials being usable, e.g. those usable in forming the dielectric ceramic sheets.

Monolithic capacitors according to the present invention may vary widely in size. Capacitors as small as 2.0 mm × 3.0 mm × 0.9 mm with 20 dielectric strata, each as thin as about 0.03 mm, and 19 internal electrodes, each as thin as about 0.01 mm, can be readily made, and larger ones are, of course, possible. Not only may the dimensions of the capacitor be varied, but the number and thickness of the strata therein may also vary. Capacitors of any desired capacitance may be obtained according to the invention by proper choice of dielectric material and the size, thickness, and number of the strata and the intervening pseudo-conductive layers. In general, it is desirable to form the dielectric strata and electrodes as thin as is feasible since a smaller amount of expensive dielectric material is used and the capacitance per unit of volume of the capacitors is thus increased, thus reducing the space required in circuits. It will be understood that the thinness of the dielectric strata islimited by the necessity of having such strata solid and non-porous and of such thickness as to withstand the voltage applied in use. Although irregularities in the surface or the thickness of the leaves of dielectric material may provide problems in the formation of capacitors where extremely thin layers of films of granule-containing, pseudo-conductive material are applied since one or more cavities between such irregular leaves may be blocked after firing, it is generally preferred to make the electrodes thinner than the dielectric strata. It will also be understood that one or more extra or additional dielectric leaves or sheets may be placed at the bottom and/or top of a stack of alternated dielectric leaves or sheets and granule-containing, thermally-fugitive layers. This is often done to give additional mechanical strength to the capacitors and/or to adjust their thickness. Unprinted leaves of a dielectric ceramic composition can be used. However, the presence of a ceramic deposit on the top dielectric film or leaf of such a stack will ordinarily not be detrimental.

Firing of green ceramic blocks, units, or chips to sinter them into unitary or monolithic bodies is preferably carried out in a kiln in an oxidizing atmosphere, such as air. An electrically heated tunnel kiln or furnace is preferred, but other kilns or other heating means may be employed. The temperature and the time of firing will depend on the ceramic compositions employed. Those skilled in the art are familiar with such details, as pointed out above, and with the fact that, in general, the sintering time necessary varies inversely with the temperature. As the term is used herein, "sintering temperature" refers to the temperature necessary to obtain the desired ceramic properties in the body or bodies. As indicated above, a prolonged period of heating at relatively low temperatures is preferred for removal of the temporary bonds used in the leaves and granule-containing layers. The removal of the thermally-fugitive materials should be sufficiently slow so that expansion of gases formed in the decomposition or vaporization thereof does not rupture the bodies.

In the general description and the examples, the leaves of insulating or dielectric material and the granule-containing, heat-fugitive deposits or layers as well as the capacitors or multilayer circuit structures formed therefrom are assumed to be rectangular. However, the present invention comprehends capacitors and circuit structures of other shapes. In such cases, obviously, alternate thin cavities and the electrodes or conductors introduced may not be exposed on opposite edge faces. Consequently, it will be understood that in the appended claims the term "edge region" is used comprehensively to indicate an area on the surface of a body of whatever shape, formed as described herein, which surface meets or interacts the plane of one or more planar spaces or cavities in said body.

In FIG. 6 there is illustrated a typical ceramic, multilayer circuit structure 81 such as is used for hybrid integrated circuits. The structure or body 81 has a ceramic matrix 83 and a plurality of conductors 85 extending into and/or through the matrix. The thickness of both conductors and matrix is exaggerated in FIG. 6 for convenience in viewing. Hitherto, such structures have been expensive to produce and normally would be made by screen printing a metallic electroding type paste containing a noble metal such as palladium or platinum in the desired conductor patterns on a plurality of temporarily bonded sheets of desired thickness of an electrically insulating, ceramic material such as fine alumina powder, stacking and consolidating the several printed sheets with one or more unprinted sheets on the top and bottom, and sintering the consolidated stack into a unitary body.

As mentioned above, such ceramic, multilayer circuit structures may also be produced by techniques essentially similar to the processes disclosed herein for producing capacitors, thus avoiding the necessity for using expensive, noble metals as conductors. The production of such a structure as shown in FIG. 6 by the technique of the present invention will be briefly described with reference to FIG. 7. It will be understood that the procedure described is only exemplary and that other procedures such, for example, as forming large ceramic blocks as in Example 2, which may be cut to produce individual circuit structure bodies, may also be used.

The sheets or films A, B, and C, shown in FIG. 7 are formed in the desired size, shape, and thickness by casting, molding, or the like, a desired ceramic, electrical insulating composition, for example, finely divided alumina, using a thermally-fugitive material such as a resin, ethyl cellulose, or the like as a temporary bond therefor. Pseudo-conductors 87 following the paths of the desired conductors 85 in the structure shown in FIG. 6 are then screen printed on the sheets or films B and C using a screen printing composition or ink consisting principally of thermally-fugitive material containing a suitable, relatively small amount of ceramic or metallic granules. It will be understood that the patterns of pseudo-conductors 87 illustrated are only examples and that any desired patterns may be employed. The printed sheets are stacked, covered by one or more unprinted top sheets, and the stack is then consolidated in suitable manner and heated to remove the thermally-fugitive materials and to sinter the ceramic material in the sheets into a unitary body, all in substantially the same manner as described above in the production of capacitors. As with the latter, the unitary or monolithic matrix produced by firing comprises a dense body of the ceramic, insulating composition having therein cavities or channels that are interrupted only by distinct pillar 86, substantially all of which are separate. Each of said channels communicates with at least one region on a face, e.g. an edge face, of said body. Conductors in and through said bodies are formed by introducing into the channels a suitable conductive material, metal being preferred.

It will be evident that except for the fact that the matrix thus produced may contain a number of thin channels between two adjacent strata of non-conductive ceramic material instead of a single thin cavity, the structure is essentially the same as that of the matrices for capacitors described hereinbefore. In both cases, the bodies when green comprise leaves of non-conductive ceramic material with a thermally-fugitive temporary bond, have intervening deposits or layers of granule-containing, thermally-fugitive material serving as pseudo-conductors, and the matrices, after sintering, comprise dense, substantially parallel, ceramic strata with intervening planar cavities, interrupted only by distinct pillars, substantially all of which are separate, into which conductive material such as metal may be introduced. Because of the variation possible in the thermally-fugitive materials and ceramic materials used in producing the bodies, the heating and sintering procedures will also vary. However, those skilled in the art will be able to choose satisfactory times and temperatures.

An appropriate one of the procedures mentioned above for introduction of conductive material may be used. Leads may be attached by suitable known means to selected exposed conductors or end termination electrodes when these are used, and small components such as transistors, diodes, etc. may be soldered at predetermined points, leads therefrom extending, if desired, to underlying conductors 85 through hole 82 provided in desired locations in one or more of the insulating ceramic strata. Such holes also may serve, when containing conductive material, to electrically connect conductors on two or more levels of the circuit board.

It will be understood that in producing multilayer circuit structures in accordance with the present invention, any desired number of sheets or leaves of the temporarily bonded, ceramic insulating composition may be used with the desired pattern of pseudo-conductors printed or otherwise applied thereon. Thus, structures with conductors on a number of different levels therein may be obtained. The thickness of the ceramic sheets and the pseudo-conductive coatings may vary within a relatively wide range. In general, however, the sheets will range in thickness from about 0.05 mm to about 0.25 mm and the pseudo-conductors will range in thickness from about 0.007 mm to about 0.04 mm. It will be seen, therefore, that relatively thin structures may contain many conductors. The width of the pseudo-conductors, and thus the channels for the conductive material, may vary as desired. However, such channels will in substantially all cases have cross-sections that are small relative to the matrix body and generally to be normal to the thin direction of the body. Because of the relative thinness of the channels relative to the width and length thereof, they can be regarded as planar cavities.

As previously indicated, there are a number of possible variations and/or modifications of the procedure set forth in Examples 1 and 2. For example, instead of screen printing a layer of thermally-fugitive material and ceramic or metallic granules on the small bonded ceramic leaves such as employed in Example 1, small pieces of a suitable, preformed, thermally-decomposible, plastic film of appropriate size and shape containing dispersed metal and/or ceramic granules and a fine combustible material can be laid in proper position between the leaves as the stack of leaves is built up. Also, the layers of granule-containing, thermally-fugitive material may be applied by painting or spraying, if desired. As a further alternative procedure, a layer consisting of granule-containing, thermally-fugitive material can be applied by suitable means to both sides of a leaf of bonded dielectric or insulating ceramic material, thereby eliminating the need for such layers on the leaves above and below it when stacking the leaves. For the purpose of providing physical protection to thin chips and increasing their resistance to breakage, one or more extra leaves, without any such layers thereon may be included in the formed stack. Although in forming multilayer circuit structures the conductor patterns may be and often are different in each of the several levels therein, it is generally desirable in capacitors produced according to the present invention to have all the internal electrodes of substantially the same size and shape. Such uniformity makes production easier and helps to ensure that the resulting products will have uniform capacitance.

It will be understood that the compositions used in forming the dielectric or insulating leaves and the pseudo-conductors used in producing ceramic matrices in accordance with the present invention may vary widely. There have been set out above numerous usable ceramic materials. There are also a great many usable media or vehicles that can be used as heat-fugitive bonding materials for these ceramic materials. Many of these are commercially available or easily prepared by those skilled in the art. Essentially, the purpose of such media and vehicles is to suspend and disperse the particle used to form the leaves and/or layers and provide a temporary, thermally-fugitive bond therefor during formation of leaves and/or layers therefrom and the production of green ceramic bodies from a plurality of leaves and layers. In the sintered ceramic bodies, the temporary bond has disappeared. Accordingly, the medium and/or vehicle used is largely a matter of choice or convenience.

Since the purpose of the heat-fugitive material in the pseudo-conductive layers is to provide support for and separate the ceramic-containing leaves or layers until the latter are self-supporting so that the desired cavities or channels will be left in the sintered matrices during the heating cycle used to remove thermally-fugitive materials, the pseudo-conductors should not adversely affect the temporarily bonded ceramic sheets and should remain until the plasticity of said sheets has decreased to such an extent that the sheets are rigid and do not deform or sag so as to closs off the cavities or channels. If the film-forming material used for printing the pseudo-conductors does not meet this requirement, it is necessary to add a particulate, thermally-fugitive material which does, enough of such material being added to the pseudo-conductor composition to produce the desired result.

In choosing such particulate, thermally-fugitive material, however, it is important to avoid those which on combustion leave appreciable ash that contains elements detrimental to the dielectric or insulating composition used in the ceramic leaves or strata. Generally suitable for the purpose are fine particles of carbon or carbonizable material such, for example, as starch and cellulose. Among the large number of thermally-fugitive, film-forming materials suitable for use with such particulate materials in forming the thermally-fugitive layers or deposits are ethyl cellulose, acryloid resins, and polyvinyl alcohol. A suitable solvent for the film-forming material is employed in such amount as to give the desired viscosity to the composition.

As previously indicated, in some cases the pillar-containing cavities or channels between the ceramic layers can be produced by the use of preformed, thermally-fugitive films, a thin film of suitable resin containing fine particles of carbon, for example, and suitable granules of metal or ceramic being usable. Also usable for the purpose is a thin deposit of a mixture of fine, granular, combustible material such as carbon and suitable granules of metal or ceramic, containing no binder, placed in the desired pattern or design on the ceramic leaves. As used herein, a "thermally-fugitive" or "heat-fugitive" material is one which, under the conditions of the processes herein described, volatilizes as such or is wholly converted, with or without oxidation, into products that volatilize.

In forming the pillars, there are a number of procedures that can be employed in addition to those above-described. For examples, a two-step printing procedure may be employed wherein a desied grid pattern of heat-fugitive material is deposited, as by screen printing, on leaves of fine dielectric or insulating material bonded by a heat-fugitive bond and then ceramic granules or ceramic material which on sintering will form pillars, dispersed in a heat-fugitive vehicle, are deposited in the vacant areas of said grid pattern. If desired, the procedure can be reversed, the ceramic or metallic granules being first deposited in a grid pattern and the heat-fugitive deposits without such granules being printed subsequently.

According to a further modification, the pillars can be formed by a method similar to that just described except that instead of using preformed granules in the vacant areas of said grid pattern there is deposited in said areas a composition containing material which on sintering forms pillars. For instance, there can be employed a conventional platinum or palladium electroding type paste which is laid down in small areas or spots of desired thickness. Still another possible procedure is to deposit, e.g. by screen printing, a layer consisting of heat-fugitive material on each of a plurality of sheets of finely divided ceramic material bonded with a heat-fugitive bond, but leaving in said layer one or more spaced-apart areas that form holes through said layer. When a plurality of sheets having such layers are consolidated and fired to remove the thermally-fugitive materials and to sinter the ceramic material, the sheets above and/or below the open areas or holes will deform sufficiently to produce ceramic pillars in said holes. After completion of the firing, of course, such pillars stand in the cavity resulting from the disappearance of the thermally-fugitive material constituting the layer.

Figure 9:
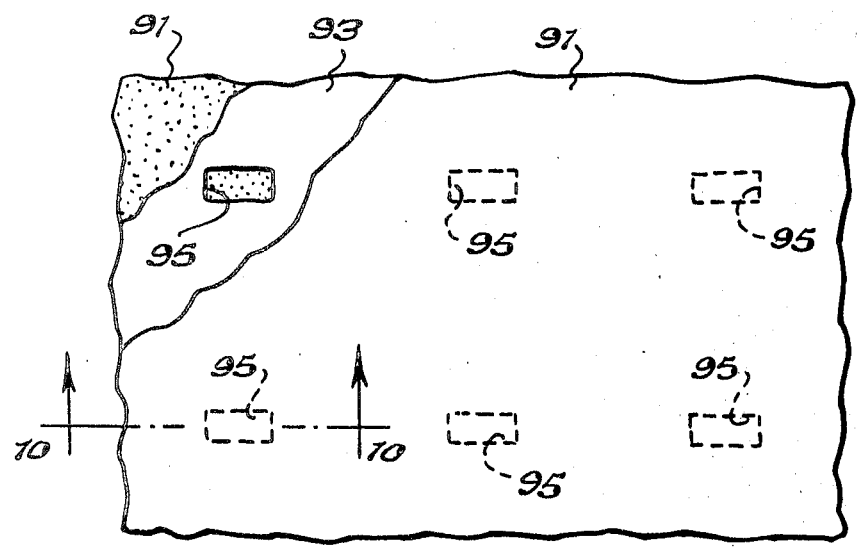
FIG. 9 is a greatly enlarged, fragmentary, plan view of a bonded leaf or sheet of ceramic, dielectric composition having thereon a patterned layer of thermally-fugitive material adapted for use in a modified process according to the invention.
Figure 10:
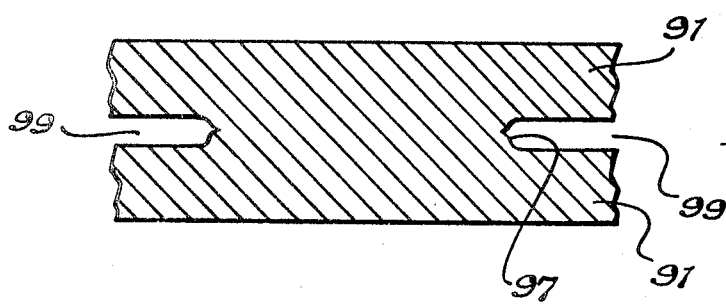
FIG. 10 is a greatly enlarged, fragmentary, sectional view of a sintered ceramic matrix formed from a plurality of leaves such as shown in FIG. 9.

FIGS. 9 and 10 illustrate diagrammatically the last-mentioned procedure. FIG. 9 is a fragmentary plan view, greatly enlarged, which shows two sheets 91 of finely divided ceramic material bonded with a suitable thermally-fugitive bond between which has been provided a layer 93 consisting of thermally-fugitive material. A plurality of spaced holes 95 have been left in the layer 93. FIG. 10 is a further enlarged, fragmentary sectional view, taken along the line 10—10 of FIG. 9. It shows a portion of the body illustrated in FIG. 9 after the body has been consolidated and fired, for example, by the procedure set forth in Example 1, to remove the thermally-fugitive materials and to sinter the ceramic material. The numeral 97 designates a ceramic pillar in the planar space 99, which pillar has been formed by deformation of the ceramic sheets above and below and extrusion of ceramic material therefrom into the hole 95. It will be understood that, although FIGS. 9 and 10 illustrate only two sheets of ceramic and an intervening layer of thermally-fugitive material, in forming a monolithic capacitor many such sheets would be superposed with such intervening layers and that similar pillars would be formed in others of the holes 95 during the consolidation and firing of the stack of sheets and layers. The shape of the holes 95 is not critical and any convenient shape can be used. Because of the difficulty encountered in providing very small holes in the layers of thermally-fugitive material, the smallest horizontal dimensions of such holes will ordinarily be several times the thickness of the thermally-fugitive layer in which they are formed. In any case, however, the smallest horizontal dimension should be at least as great as the thickness of such layer. The number and arrangement of the holes may vary in accordance with the number and placement of the pillars desired. Not only can pillars of the type here described be used in the process of Example 1, but also in the processes of Examples 2 and 3. Such pillars can also, in some cases, be employed in forming multilayer circuit structure matrices where the size of the channels for the conductors permits.

It should be understood that the function of the pillars is to provide some support in the cavities or channels of fired bodies according to the invention, whereby the compressive strength of the bodies will be increased sufficiently to reduce possibility of breakage in handling. Obviously the number of pillars necessary to give the desired strength will vary with the size and shape of the cavities or channels. To maintain an open structure in the cavities or channels the pillars should not exceed in volume 40% of the volume of the cavity or channel and in most cases 10% by volume or even less will be desirable. Indeed, where the cavity or channel is very small only a single pillar may be desired. When the pillars are formed by ceramic or metallic granules in a pseudo-conductive layer they will, of course be randomly located. However, as mentioned above, they should be separated so as to provide no substantial impediment to entry of conductive material into the cavities and therefore the concentration of granules in the pseudo-conductor should be no greater than required to obtain the desired strength. Preferably the pillars are of a diameter approximating the thickness of the pseudo-conductor in which they are held.

As stated above, the conductive material introduced into the thin cavities to form internal electrodes in producing capacitors or to form conductors in circuit structures is preferably a metal. This term is meant to include single metals as well as alloys and in some cases can include semi-metals or metalloids; e.g. germanium. Suitable metals include lead, tin, zinc, aluminum, silver, and copper. The metal employed should have a melting point lower than the maximum temperature employed in sintering the ceramic of the matrix and should not react deleteriously with ingredients of the matrix.

As used herein the term "dense" means that the material so designated absorbs substantially no water when immersed therein and "thin" is a relative term, which with reference, for example, to the ceramic strata indicates a thickness of the order of 0.5 mm or less. Such strata can, however, for specific purposes, be thicker.

The terms "upper", "lower", "top", "bottom", "right", "left", "above", "below", and similar terms of position and/or direction as used herein refer to the illustrations in the accompanying drawings but are used only for convenience in description or reference. Such terms should not be so construed as to imply a necessary positioning of the structures or portions thereof or to limit the scope of this invention.

In the foregoing specification and the appended claims, parts and percentages are by weight.

We claim:

1. A process for forming a unitary, ceramic body suitable for use in making a capacitor which comprises: providing a plurality of thin leaves of finely divided ceramic composition bonded with a thermally-fugitive bond, said ceramic composition forming a dense, dielectric layer when fired to sintering temperatures; forming a consolidated stack consisting of a plurality of said leaves having interposed between at least two of said leaves a thin layer which consists of thermally-fugitive material and a minor amount of granules selected from the class consisting of ceramic and metallic granules of such size as to extend substantially through said layer, said layer having a smaller area than that of the adjacent leaves and said leaves being so arranged and placed that major portions of the edges of the leaves adjacent said layer are in contact with each other with said layer extending to an edge region of said consolidated stack; and firing said consolidated stack under suitable conditions at temperatures sufficiently high to remove said thermally-fugitive materials and to sinter said ceramic composition, whereby to form an integral, monolithic, sintered ceramic body having a plurality of thin strata of dense dielectric material, substantial portions of the adjacent surfaces of at least two of said strata being separated to provide a space therebetween and being joined only at edge portions thereof and by at least one distinct pillar formed of material selected from the class of ceramic and metallic materials extending from the top to the bottom of said space, substantially all of said pillars being separate when there are a plurality thereof.

2. A process as set forth in claim 1 wherein there are provided a plurality of said thin layers, each between a pair of adjacent leaves, each of said layers having a smaller area than that of said adjacent leaves, said leaves being so arranged and placed that major portions of the edges of the leaves adjacent said layers are in contact and successive ones of said layers extend to different edge regions of said consolidated stack, whereby to form, on sintering, an integral, monolithic, sintered ceramic body having a plurality of thin strata of dense dielectric material, a plurality of said strata being separated to provide spaces therebetween and being joined only at edge portions thereof and by at least one distinct pillar formed of material selected from the class of ceramic and metallic materials extending from the tops to the bottoms of said spaces, substantially all of said pillars being separate when there are a plurality thereof.

3. A process for forming unitary ceramic bodies suitable for use in making capacitors which comprises: providing a plurality of thin sheets of finely divided ceramic composition bonded with a thermally-fugitive bond, said ceramic composition forming a dense, dielectric layer when fired to sintering temperatures; providing on a plurality of spaced areas on each of a plurality of said sheets a coating which consists of thermally-fugitive material and a plurality of granules selected from the class consisting of ceramic and metallic granules of such size as to extend substantially through said coating; forming a stack comprising a plurality of said coated sheets with at least certain of the coated areas on said coated sheets being partially superposed; consolidating said stack; firing said consolidated stack under suitable conditions at temperatures sufficiently high to remove said thermally-fugitive materials and to sinter said ceramic composition into a monolithic block; and severing said block into smaller bodies each of which comprises a plurality of thin strata of dense dielectric material, substantial portions of the adjacent surfaces of a plurality of said strata being separated to provide spaces therebetween which extend to edge regions of said body, said separated strata being joined only at edge portions thereof and by a plurality of distinct pillars formed of material selected from the class of ceramic and metallic materials extending from the tops to the bottoms of said spaces, substantially all of said pillars being separate.

4. A process for forming unitary ceramic bodies suitable for use in making capacitors which comprises: providing a plurality of thin sheets of a finely divided ceramic composition bonded with a thermally-fugitive bond, said ceramic composition forming a dense, dielectric layer when fired to sintering temperatures; providing on a plurality of spaced areas on each of a plurality of said sheets a coating which consists of thermally-fugitive material and a plurality of granules selected from the class consisting of ceramic and metallic granules of such size as to extend substantially through said coating; forming a stack of a plurality of said coated sheets with at least certain of the coated areas on a plurality of said sheets being partially superposed; consolidating said stack into a green block; severing said green block by vertical cuts therethrough whereby to obtain a plurality of small bodies or chips in each of which at least one of said coated areas is exposed at one of a plurality of edge regions; firing said chips under suitable conditions at temperatures sufficiently high to remove said thermally-fugitive materials and to sinter said ceramic composition, whereby to form integral, monolithic, sintered ceramic chips, each of which comprises a plurality of thin strata of dense, dielectric material, substantial portions of the adjacent surfaces of a plurality of said strata in each chip being separated to provide spaces therebetween which extend to edge regions of said chip, said separated strata being joined only at edge portions thereof and by a plurality of distinct pillars formed of material selected from the class of ceramic and metallic materials substantially all of which are separate.

5. A process for forming a sintered ceramic matrix having thin, substantially void spaces therein which comprises: forming a consolidated stack comprising a plurality of relatively thin sheets of finely divided ceramic material bonded with a thermally-fugitive bond, a plurality of said sheets bearing a predetermined design thereon, said design being formed of a composition composed of thermally-fugitive material and a minor amount of granules selected from the class consisting of ceramic and metallic granules of such size as to extend substantially through the thickness of said designs, said designs in said consolidated stack being separated by said sheets; and heating said consolidated stack to remove said thermally-fugitive material and to form a sintered, monolithic, ceramic matrix having therein substantially thin void spaces corresponding to said designs, said spaces being interrupted only by said granules.

6. A process for forming a unitary ceramic body suitable for use in making a capacitor which comprises: providing a plurality of thin leaves of finely divided ceramic composition bonded with a thermally-fugitive bond, said ceramic composition forming a dense, dielectric layer when fired to sintering temperatures; forming a consolidated stack consisting of a plurality of said leaves having interposed between at least two of said leaves a thin layer which consists of thermally-fugitive material and a minor amount of granules selected from the class consisting of ceramic and metallic granules of such size as to extend substantially through said layer, said layer having a smaller area than that of the adjacent leaves and said leaves being so arranged and placed that major portions of the edges of the leaves adjacent said layer are in contact with each other, with said layer extending to an edge region of said consolidated stack; and firing said consolidated stack under suitable conditions at temperatures sufficiently high to remove said thermally-fugitive materials and to sinter said ceramic composition, whereby to form an integral, monolithic, sintered ceramic body having a plurality of thin strata of dense dielectric material, substantial portions of the adjacent surfaces of at least two of said strata being separated to provide therebetween a thin space, bounded above and below by said surfaces, and being joined only at edge portions thereof and by at least one distinct pillar formed of material selected from the class of ceramic and metallic materials extending from the top to the bottom of said space, substantially all of said pillars being separate when there are a plurality thereof.

7. A process as set forth in claim 6 wherein there are provided a plurality of said thin layers, each between a pair of adjacent leaves, each of said layers having a smaller area than that of said adjacent leaves, said leaves being so arranged and placed that major portions of the edges of the leaves adjacent said layers are in contact and successive ones of said layers extend to different edge regions of said consolidated stack, whereby to form, on sintering, an integral, monolithic, sintered ceramic body having a plurality of thin strata of dense dielectric material, a plurality of said strata being separated to provide therebetween thin spaces, bounded above and below by adjacent strata, said strata being joined only at edge portions thereof and by at least one distinct pillar in each said space, said pillar being formed of material selected from the class of ceramic and metallic materials and extending from the top to the bottom of said space, substantially all of said pillars being separate when there are a plurality thereof.

8. A process as set forth in claim 1 in which said pillars are ceramic.

9. A process as set forth in claim 1 in which said pillars are metallic.

10. A process as set forth in claim 2 in which said pillars are ceramic.

11. A process as set forth in claim 2 in which said pillars are metallic.

12. A process as set forth in claim 3 in which said pillars are ceramic.

13. A process as set forth in claim 3 in which said pillars are metallic.

14. A process as set forth in claim 4 in which said pillars are ceramic.

15. A process as set forth in claim 4 in which said pillars are metallic.

16. A process as set forth in claim 5 in which said granules are ceramic.

17. A process as set forth in claim 5 in which said granules are metallic.

18. A process as set forth in claim 6 in which said pillars are ceramic.

19. A process as set forth in claim 6 in which said pillars are metallic.

20. A process as set forth in claim 7 in which said pillars are ceramic.

21. A process as set forth in claim 7 in which said pillars are metallic.

22. A green ceramic body adapted for firing to form a ceramic matrix having a predetermined pattern of thin spaces therein which comprises: a consolidated stack of thin sheets of a sinterable ceramic material bonded with a thermally-fugitive bond, at least one of said sheets in said stack having, between it and the sheet next above in said stack, at least one pseudo-conductor in said predetermined pattern, said pseudo-conductor being of the same order of thickness as said sheets and consisting of thermally-fugitive material with a minor amount of granules of a size substantially the same as the thickness of said pseudo-conductor.

23. A green ceramic body as defined in claim 22 wherein said pseudo-conductor is thinner than the sheets adjacent thereto.

24. A green ceramic body as defined in claim 23 wherein said pseudo-conductor is exposed on a surface of said body.

25. A green ceramic body as defined in claim 22 wherein there are provided a plurality of pseudo-conductors.

26. A green ceramic body as defined in claim 25 wherein at least some of said pseudo-conductors are on different levels.

* * * * *

UNITED STATES PATENT AND TRADEMARK OFFICE
CERTIFICATE OF CORRECTION

PATENT NO. : 4,353,957
DATED : October 12, 1982
INVENTOR(S) : Truman C. Rutt and James A. Stynes It is certified that error appears in the above—identified patent and that said Letters Patent is hereby corrected as shown below:

In column 4, line 36, change "ball-miling" to --ball-milling--.

In column 4, line 59, change "naptha" to --naphtha--.

In column 4, line 66, change "naptha" to --naphtha--.

Signed and Sealed this

Twenty-ninth Day of March 1983

[SEAL]

Attest:

*Attesting Officer*

GERALD J. MOSSINGHOFF
*Commissioner of Patents and Trademarks*